(12) United States Patent
Karg et al.

(10) Patent No.: US 7,961,493 B2
(45) Date of Patent: Jun. 14, 2011

(54) PROGRAMMABLE DEVICE

(75) Inventors: Siegfried Friedrich Karg, Zurich (CH); Gerhard Ingmar Meijer, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 77 days.

(21) Appl. No.: 12/478,316

(22) Filed: Jun. 4, 2009

(65) Prior Publication Data

US 2009/0302886 A1 Dec. 10, 2009

(30) Foreign Application Priority Data

Jun. 6, 2008 (EP) .................................... 08104301
Jun. 6, 2008 (EP) .................................... 08104303

(51) Int. Cl.
*G11C 11/22* (2006.01)
(52) U.S. Cl. ........................................ 365/145; 365/158
(58) Field of Classification Search .................. 365/145, 365/158
See application file for complete search history.

(56) References Cited

U.S. PATENT DOCUMENTS

| 6,201,259 B1* | 3/2001 | Sato et al. ........................ 257/30 |
| 6,201,386 B1* | 3/2001 | Jones et al. .................... 324/205 |
| 7,042,669 B2* | 5/2006 | Ogawa et al. ................... 360/55 |

* cited by examiner

*Primary Examiner* — Michael T Tran
(74) *Attorney, Agent, or Firm* — Gail H. Zarick

(57) ABSTRACT

A programmable device including a source-drain-gate structure. The device includes two programming electrodes and an antiferromagnetic multiferroic material between the two programming electrodes for switching the spontaneous polarization between a first spontaneous polarization direction and a second spontaneous polarization direction. The programmable device further includes a ferromagnetic material, which is in immediate contact with the multiferroic material. Magnetization of the ferromagnetic material is switchable by a transition between the first switching state and the second switching state of the multiferroic material by an exchange coupling between electronic states of the multiferroic material and the ferromagnetic material. The programmable device also includes means for determining a direction of the magnetization of the ferromagnetic material. A spin valve effect is used for causing an electrical resistance between the source and the drain electrode.

24 Claims, 7 Drawing Sheets

PROGRAMMABLE DEVICE

CROSS REFERENCE TO RELATED APPLICATIONS

This application claims priority under 35 U.S.C. 119 from European Patent Application 08104301.0, filed Jun. 6, 2008 and from European Patent Application 08104303.6, filed Jun. 6, 2008, the entire contents of both of which are incorporated herein by reference.

BACKGROUND OF THE INVENTION

1. Field of the Invention

The present invention relates to programmable devices and, more particularly, to a memory element containing a plurality of such programmable devices and a logic circuit containing such programmable devices.

2. Description of Related Art

Memory and logic devices such as complementary metal-oxide-semiconductor (CMOS) are major classes of integrated circuits. They are used in processor and memory chips such as microprocessors, microcontrollers, solid-state stand-alone and embedded memory circuits and other digital logic circuits.

The most widely used memory technologies are DRAM, SRAM, Floating gate (Flash), and MRAM. These existing technologies can not be integrated with high areal density and provide at the same time non-volatile and fast operation. In particular, Flash is too slow for many embedded applications, SRAM and DRAM loose their memory state when disconnected from a power supply, and SRAM and MRAM can only be manufactured with a limited areal density. In addition, the high programming voltage of Flash complicates integration with CMOS circuitry.

The logic state of CMOS is volatile and the input voltage has to be maintained. Always maintaining the input voltage will lead to considerable power consumption and heating in future CMOS generations.

WO 2007/110950 proposes the use of ferromagnetic multiferroic materials for building memory devices. However, such devices suffer from disadvantages. For example, currently no multiferroics are known that possess ferroelectric and ferromagnetic ordering at room temperature. Further, such devices would not be suited for significant miniaturization because below a certain size the superparamagnetic limit is reached. The term "superparamagnetic limit" is the size at which the magnetic anisotropy of a magnetic layer in a cell becomes comparable to kT, where k is Boltzmann's constant and T is the absolute temperature. The magnetization becomes unstable below that limit.

SUMMARY OF THE INVENTION

A programmable device according to a first embodiment of the present invention includes: a source electrode; a drain electrode; and a gate made of antiferromagnetic multiferroic material. The gate is switchable by application of an electrical signal between a first switching state with a first spontaneous polarization direction and a second switching state with a second spontaneous polarization direction. A first material selected from the group consisting of ferromagnetic material and ferrimagnetic material is in immediate contact with the multiferroic material. A magnetization of the first material is switchable by a transition between the first switching state and the second switching state of the multiferroic material by an exchange coupling between electronic states of the multiferroic material and the first material. The device further includes means for determining a direction of the magnetization of the first material.

According to another embodiment, the device of the present invention includes: a source electrode; a drain electrode; a gate made of a multiferroic material; an electrical resistance between the source electrode and the drain electrode providing a current path via a channel region. The electrical resistance is switchable by application of an electrical signal to the gate, the current path provides a junction between a channel region material and a current path ferromagnetic material, and the electrical resistance between the source electrode and the drain electrode is switchable due to a spin valve effect so that a switching state of the multiferroic material influences a relative orientation of magnetic moments of charge carriers flowing across the junction and a magnetization of the current path ferromagnetic material.

In other embodiments, groups of the above devices are used to create logic elements and memory elements.

BRIEF DESCRIPTION OF THE DRAWINGS

The drawings are all schematic and not to scale. In the drawings, same reference numerals in different figures refer to same or corresponding elements.

DETAILED DESCRIPTION OF THE PREFERRED EMBODIMENTS

Figure 1A:
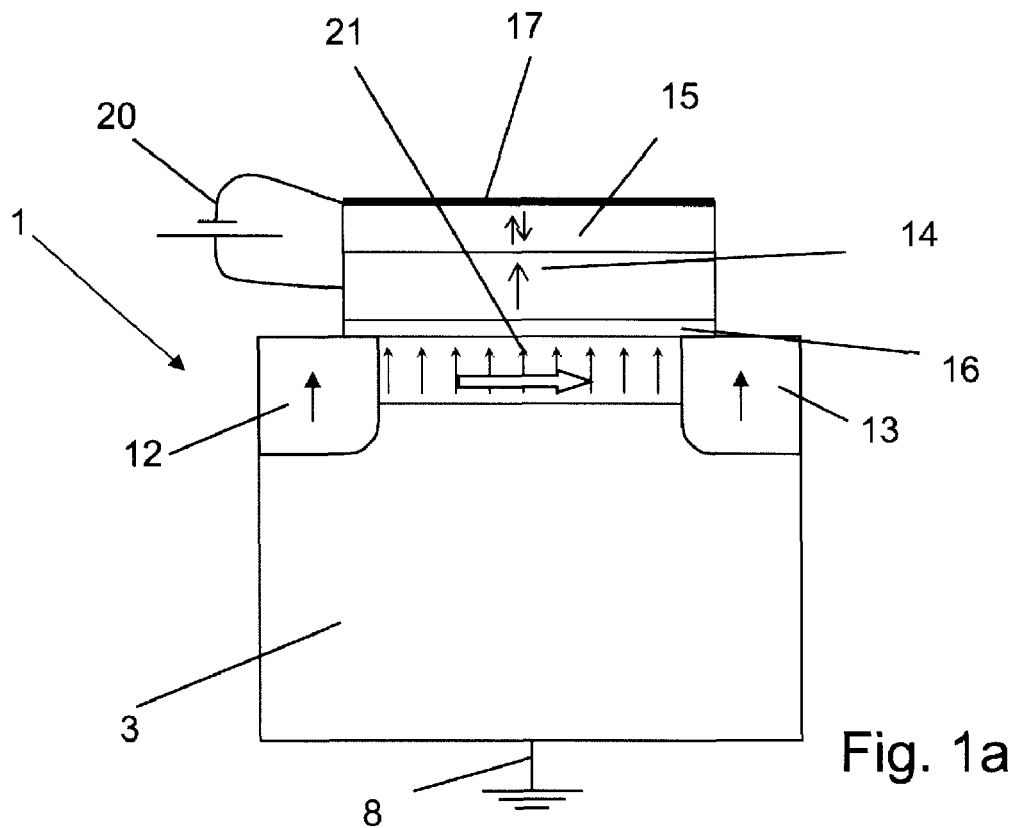
FIGS. 1a and 1b show cross sections through a first embodiment of a programmable device in two switching states.

The present invention provides a programmable device capable of serving as building blocks for memory and logic elements overcoming the drawbacks of prior art memory and logic cells. In particular, the programmable device is non-volatile, and in addition makes high areal density and/or fast operation possible.

Ferroelectric materials possess a spontaneous polarization that is stable and can be switched hysteretically by an applied electric field. Multiferroic antiferromagnets possess simultaneous ferroelectric and antiferromagnetic ordering. These two order parameters are coupled.

The multiferroic material is therefore programmable by application of an electrical signal, for example by the application of an electric field pulse, across it. Due to the coupling of the antiferromagnetic order parameter to the ferroelectric order parameter, the antiferromagnetic order parameter is also programmable. Due to the exchange coupling of the antiferromagnet to the ferromagnetic material, the magnetization direction of the ferromagnetic material is also switched.

The means for determining a direction of the magnetization of the ferromagnetic material may, according to one preferred embodiment, be based on a spin valve effect. To this end, an electrical resistance between the source and drain electrodes and across a channel region between them is switchable by the ferromagnetic material. The current path between the source electrode and the drain electrode includes a junction between a channel region material and ferromagnetic material, for example of the drain electrode. In general, the ferromagnetic material of the drain (or source) electrode or of the other ferromagnetic element in the current path is called current path ferromagnetic material. The spin valve effect may then be used in one of the following two configurations.

(i). The current path ferromagnetic material (which may be, for example, a drain electrode ferromagnetic material) has a fixed magnetization and serves as ferromagnetic detector, whereas the gate ferromagnetic material in immediate contact with the multiferroic material causes a stray field influencing the magnetic moment's orientation of charge carriers flowing in the channel region. Herein, the terms "gate ferromagnet", "ferromagnet", "ferromagnetic layer" and "ferromagnetic material" include ferrimagnetic material, those skilled in the art recognizing that the stray field producing function of ferromagnets can also be fulfilled by a ferrimagnet.

(ii). The current path ferromagnetic material is the ferromagnetic material in immediate contact with the multiferroic material. The charge carriers flowing in the channel region have a fixed preferred orientation because, for example, they are oriented by a stray field of a fixed direction ferromagnet or because they are injected from a ferromagnetic injector (source).

The programmable device features the advantage of being non-volatile because the ferroelectric and magnetic order parameters of the multiferroic material are non-volatile. Due to its non-volatile character, low power consumption can be expected.

Also, changing the ferroelectric polarization of a multiferroic element is an inherently fast process (50 ps). The programmable device according to the present invention therefore has a significant programming speed advantage compared to flash memory (1 µs).

Depending on the measuring method, the programmable device can be implemented in a simple, small unit cell (having a required space of only $6F^2$ in a one transistor structure without any additional resistors or capacitors) and thus is suitable for integration with higher areal density than prior art programmable devices. Also, it scales well when going to smaller cells, because it does not include any capacitors.

A further advantage of the programmable device, especially compared to MRAM, is a reduced write energy of about $10^{-15}$ J/bit versus $10^{-11}$ J/bit for MRAM.

A still further advantage of the programmable device, especially compared to Flash, is a lower programming voltage of around 1 V versus 15 V for Flash.

With the present invention, the more temperature stable antiferromagnetic multiferroics can be used. Also, there is the advantage that the superparamagnetic limit is not a concern in antiferromagnets, so the cell may be designed to be comparably smaller and still be stable.

An example of a useable antiferromagnetic multiferroic material suitable for the present invention is $BiFeO_3$.

Among the usable ferromagnetic multiferroics are Boracite ($Ni_3B_7O_{13}I$), Perovskites like $BiMnO_3$ and $TbMnO_3$, and Sulfates such as $CdCr_2S_4$. In these currently known materials, the coupled order parameters are non-zero at low temperatures only, so the programmable device and elements made therewith are primarily suited for special applications where cooled devices are acceptable. This embodiment of the present invention will increase in usability with multiferroic ferromagnetic materials that are stable at and above room temperature.

According to an embodiment, the multiferroic material is a multiferroic antiferromagnet coupled (in general by exchange bias coupling) to either a gate ferromagnet or to the drain (or source) electrode, pinning the same. This "ferromagnet pinning" embodiment features the advantage that known antiferromagnetic multiferroics are more temperature stable than their ferromagnetic counterparts. Also, there is the advantage that the superparamagnetic limit (i.e. the size at which the magnetic anisotropy of a magnetic layer in a cell becomes comparable to kT, where k is Boltzmann's constant and T is the absolute temperature, so that the magnetization becomes unstable below that limit) is not an issue in antiferromagnets, so the cell may be designed to be comparatively small and still be stable.

The programmable device according to the present invention can be used both as a memory cell of a memory device and as a logic element of a logic circuit. If the conducting channel is semiconducting (doped or undoped), the programmable device can be used in the manner of a conventional FET as well as, for example, select-transistor for the read operation.

The programmable device according to an embodiment of the present invention comprises a source-drain-gate functional structure (this does not imply that the physical design necessarily has to be similar to the one of a field effect transistor), i.e. a source electrode and a drain electrode between which a channel region is established, where charge carriers can flow between the source and the drain electrode, dependent on the application of an electrical signal to the gate. The channel region can, as is known in the art, be an electrical conductor, semiconductor or insulating material (thus including comparably few free charge carriers) or be doped to be conducting; the configuration of the channel region is not essential for the present invention. The gate comprises a multiferroic material, thus a material with at least two coupled order parameters. According to one preferred embodiment of the present invention, a spin valve effect is used for causing an electrical resistance between the source and the drain electrode (for an electrical current flowing in at least one direction between the source and drain electrode) to be switchable. To this end, preferably the drain electrode (and/or the source electrode in case of p-type conduction) is ferromagnetic. As an alternative to the drain electrode (and/or source electrode) being ferromagnetic, another element on the current path between the source and the drain contacts may be ferromagnetic, whereby a junction between a non-ferromagnetic material and a ferromagnetic material is present, which can exhibit a spin valve effect. In general, the ferromagnetic material of the drain (or source) electrode or of the other ferromagnetic element in the current path is called "current path ferromagnetic material".

The multiferroic material generally is arranged between two electrodes, one of which belongs to the gate, between which a voltage can be applied so that the ferroelectric spontaneous polarization can be oriented. The multiferroic material is capable of influencing the relative orientation of the magnetic moments of charge carriers flowing to the drain electrode and of a magnetization of the drain electrode (or other current path ferromagnetic material). This means that the multiferroic material can either produce a magnetic field influencing the magnetic moments of the charge carrier flowing in the conducting channel, or can switch the magnetization direction of the drain electrode magnetization.

Using the present invention, memory and logic circuits can be integrated without additional mask steps, thus providing a manufacturing cost advantage for such integrated circuits.

In the ferromagnetic materials of elements depicted in the figures, filled arrows generally indicate fixed magnetizations, magnetizations that are pinned in some way, that have a coercive field that is higher than the sum of effective fields acting on them during normal operation or that are otherwise influenced not to change a magnetization direction during normal operation of the programmable device. Open arrows indicate magnetizations that are switchable by the programming voltage pulse signals.

Figure 1B:
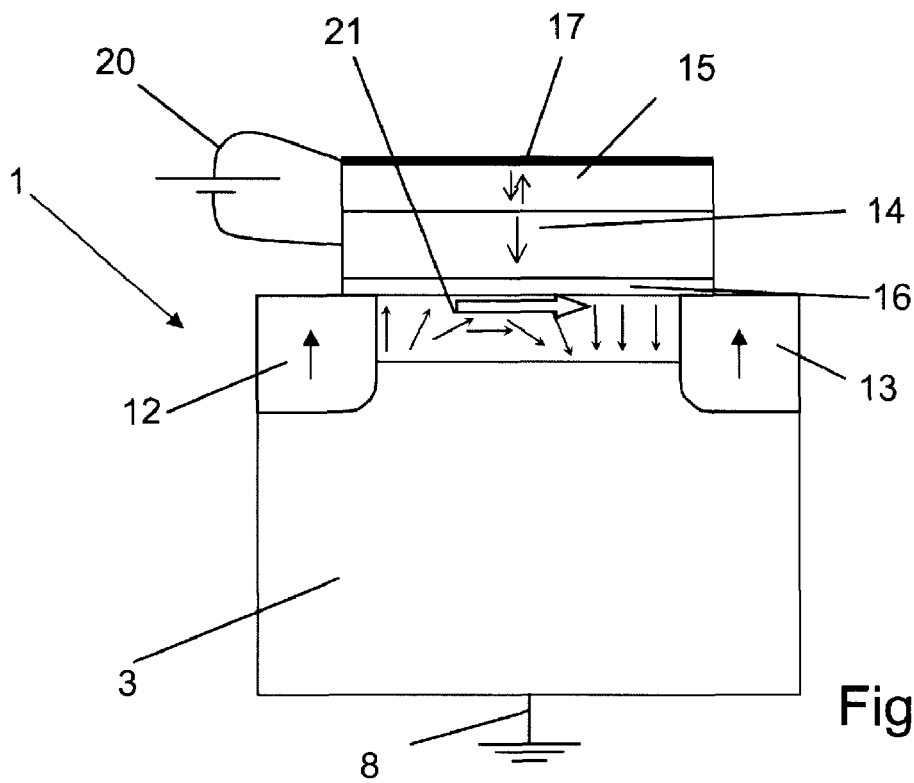

Referring to FIGS. 1a and 1b, a programmable device 1 includes, on a substrate 3, a source electrode 12 and a drain electrode 13, both of a ferromagnetic electrically conducting material, for example of a Cobalt alloy or Permalloy (an FeNiCo alloy). Between the source and drain electrodes, a conducting channel 21 is formed, for example by an n-doped region in the substrate or in any other suitable manner; the conducting channel may, but need not, include the same material as the substrate 3.

The substrate may be any suitable substrate, such as a semiconducting substrate, for example Gallium Arsenide or Silicon. The substrate in the depicted embodiment is contacted by a reference voltage contact, namely a ground contact 8 (or "bulk" contact). As is known in the art, there may be a contact or connection (not shown) between, for example, the source electrode 12 and the ground contact 8, so that the former is always at ground potential (or another reference potential as the case may be).

The programmable device 1 further includes a gate that includes a gate electrode 17, a ferromagnetic layer 14 of any ferromagnetic electrically conducting material, and an antiferromagnetic multiferroic layer 15 sandwiched between the gate electrode and the ferromagnetic layer. The ferromagnetic layer is insulated by a dielectric layer 16 from the source and drain electrodes 12, 13 and from the conducting channel 21.

A programming voltage 20 may be applied between the ferromagnetic layer 14 and the gate electrode 17. As a result, the spontaneous polarization of the multiferroic material may be switched between a first and a second state depicted in FIGS. 1a and 1b, respectively. Because the material is multiferroic, the switching of the ferroelectric spontaneous polarization also switches the according antiferromagnetic order parameter, for example by reversing the sequence of "up" and "down" magnetized layers in the multiferroic material. The ferromagnetic layer 14, being immediately adjacent to the multiferroic layer 15, is exchange coupled to the multiferroic layer. Due to this, the switching of the ferroelectric spontaneous polarization of the multiferroic layer 15 has the effect of also switching the magnetization direction of the ferromagnetic layer 14.

In FIGS. 1a and 1b, source electrode 12 functions as a ferromagnetic injector (in the case of n-type conduction), and the drain electrode 13 as a ferromagnetic detector. The stray field of the ferromagnetic layer 14 influences the charge carriers (symbolized by small arrows depicting the charge carriers' magnetic moments in the figures).

In FIG. 1a, the magnetization of the ferromagnetic layer 14 is parallel to the magnetization of the source electrode 12. The magnetic moment of the majority of the charge carriers is therefore oriented parallel to the magnetic field produced by the ferromagnetic layer and acting on them. The majority charge carriers therefore maintain their magnetic moment when propagating in the direction of the block arrow in FIG. 1a. The magnetization of the drain electrode 13 is now chosen to be such that the charge carriers with the maintained magnetic moment can easily enter the drain electrode. The programmable device in the configuration of FIG. 1a is in the "open" state.

In contrast thereto, in FIG. 1b the programming voltage 20 of the inverse polarity causes the magnetization of the ferromagnetic layer to be oriented in the direction opposite to the direction depicted in FIG. 1a. The majority of the charge carriers injected by the source electrode 12 have a magnetic field oriented antiparallel to the magnetic stray field produced by the ferromagnetic layer 14, so that the magnetic moment is reversed on the path from the source electrode to the drain electrode. Due to the electronic structure of the magnetized drain electrode, however, the charge carriers encounter an energy barrier (for example for having to again flip their magnetic moment) when entering the drain electrode material. This energy barrier effect, called "spin valve effect," is similar to the effect that is also responsible for "giant magnetoresistance" or "tunneling magnetoresistance" and is described in literature.

Because this energy barrier causes a higher electrical resistance compared to the "open" state, the programmable device in FIG. 1b is in the "closed" state.

In applications where the programmable device is a memory element, the "open" and "closed" states will often be referred to as "0" and "1"; this holds for all embodiments.

Note that in the described embodiment, the configuration where the charge carrier magnetic moment is parallel to the drain (ferromagnetic detector), electrode magnetization is assumed to be the configuration with the small energy barrier and low resistance, whereas the antiparallel configuration is the one with the high energy barrier and high resistance. This need not be the case. Rather, depending on the band structure of the drain electrode material, the opposite can be true, for example, if the drain electrode material comprises a so-called "strong" ferromagnet where there are no free states for charge carriers in the majority band.

As for all other embodiments, in the case of p-type conduction, where the charge carriers may be viewed as "holes" instead of electrons, the roles of the source and drain contacts may be interchanged, but the principle remains the same.

The programming voltage may optionally be applied as only a programming pulse. Because of the non-volatile nature of the switching state in a multiferroic material, the state is retained even when the power supply is disconnected.

Figure 2A:
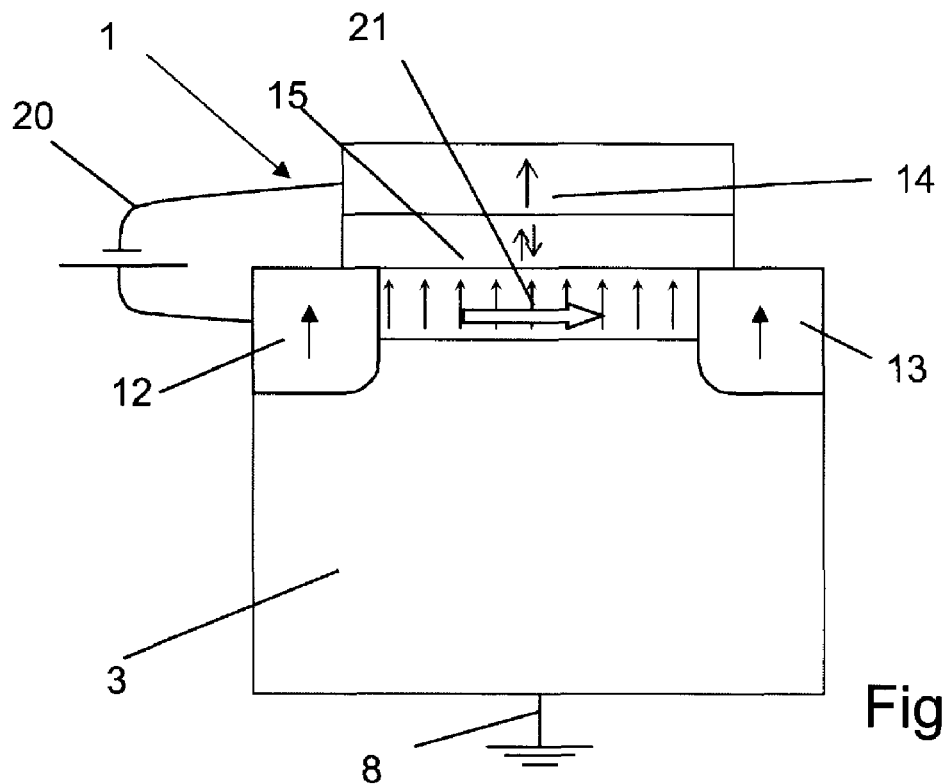
FIGS. 2a and 2b show cross sections through a second embodiment of a programmable device in two switching states.
Figure 2B:
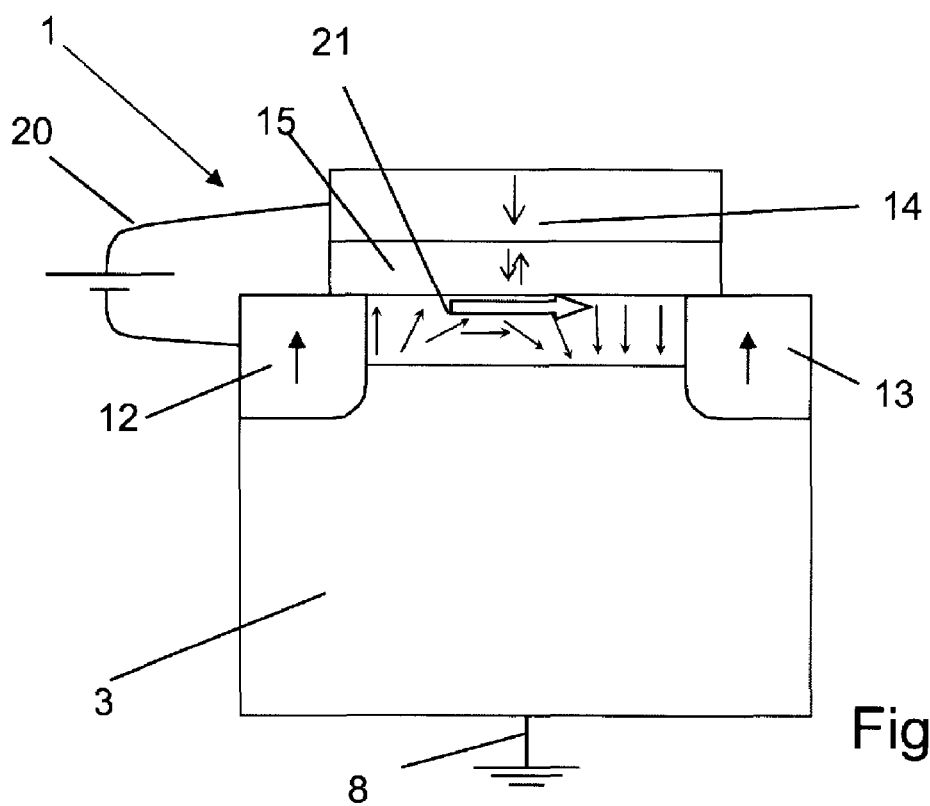

The programmable device 1 of FIGS. 2a and 2b (showing, in analogy to FIGS. 1a and 1b, the open and closed states, respectively) is different from the one of FIGS. 1a and 1b in that the sequence of the multiferroic layer 15 and of the ferromagnetic layer 14 is reversed. The multiferroic layer 15 is sandwiched between the ferromagnetic layer 14 on one side and the conducting channel 21 and the source and drain electrodes on the other side. The dielectric layer 16 then is not necessary any more because the multiferroic material 15, in contrast to most of the commonly used ferromagnetic materials, is electrically insulating.

Also, a separate gate electrode layer 17 is optional and not shown in the drawings, since the ferromagnetic layer 14 can optionally serve as the gate electrode.

In FIGS. 2a and 2b, the programming voltage 20 may be applied between the gate electrode (ferromagnetic layer 14) and the source electrode 12 or the drain electrode 13. In contrast to FIGS. 1a and 1b, no separate contact (the fifth contact, if the "bulk" electrode is also counted) for the ferromagnetic layer is needed. The stray magnetic field produced by the ferromagnetic layer 14 impinges on the charge carriers flowing in the conducting channel 21 through the multiferroic material 15 instead of through the dielectric material 16. Apart from this difference, the functioning principle is analogous to the one of FIGS. 1a and 1b.

Although in FIGS. 1a-2b, the source electrode 12 functions as a spin injector injecting charge carriers with magnetic moment orientation parallel to the magnetization of ferromagnetic layer 14 when the device is in the "open" state, this need not be the case. Rather, it is also possible to have the situation where the source electrode injects charge carriers with magnetic moment antiparallel to the to the magnetization of ferromagnetic layer 14 when the device is in the "open" state. Then the magnetic moments are reversed along the path from the source electrode to the drain electrode in the "open" state and maintain their orientation in the "closed" state.

Figure 3A:
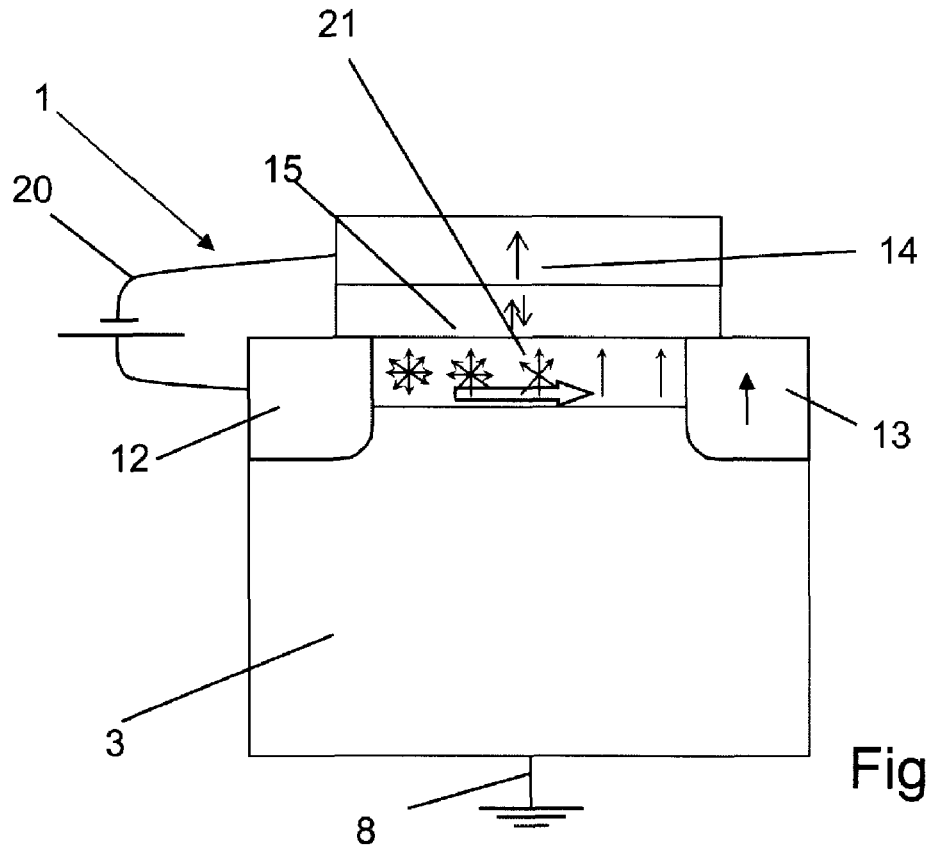
FIGS. 3a and 3b show cross sections through a third embodiment of a programmable device in two switching states.
Figure 3B:
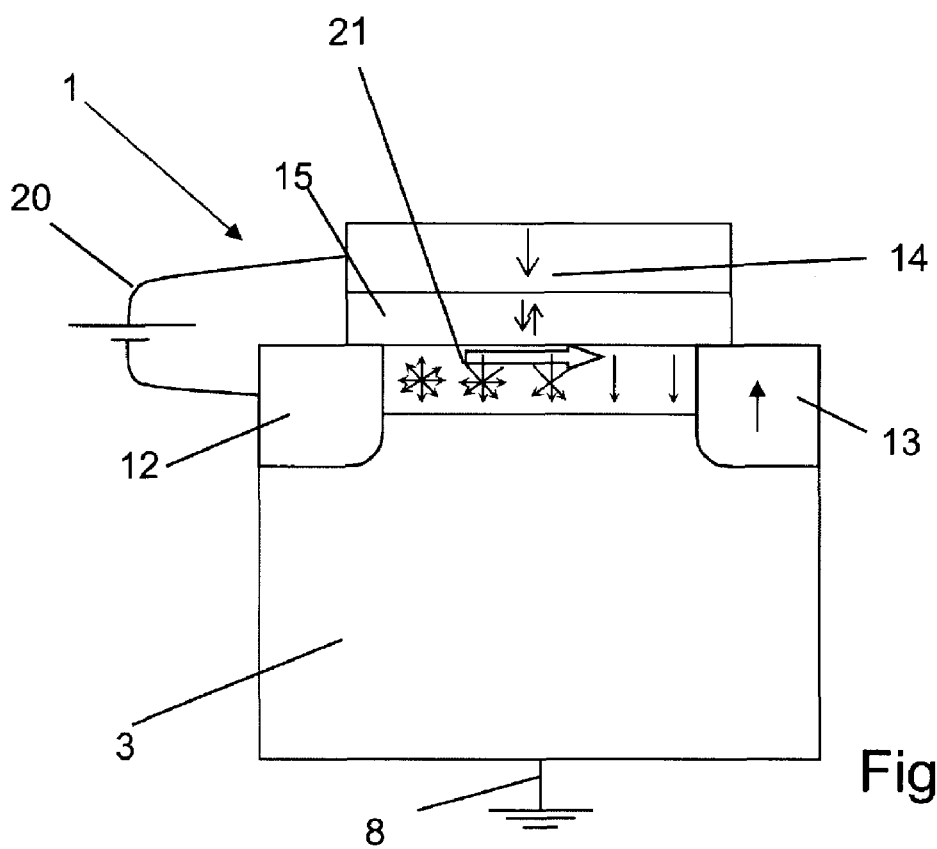

Referring to FIGS. 3a and 3b, yet another alternative, in which unpolarized charge carriers are injected, is shown. In any case, the "open" and "closed" states are distinct in that the magnetic moments of a majority of charge carriers encounters and a magnetization of the drain electrode are oriented relative to one another so that the charge carriers encounter a higher resistance when entering the drain electrode in the closed state than in the open state.

The embodiment of FIGS. 3a and 3b (showing, in analogy to FIGS. 2a and 2b, the open and closed states of the programmable device 1, respectively) is distinct from the one of FIGS. 2a and 2b in that the source electrode 12 is not ferromagnetic but injects essentially unpolarized charge carriers. The magnetic moments of the charge carriers are then aligned while transiting the conducting path. The spin valve effect works in the same way as in the above-described embodiments.

The principle of non-polarized spin injection may also be used in combination with all other embodiments, thus including the structures of FIGS. 1a, 1b, and of FIGS. 4a, 4b, and 6a, 6b described below.

Figure 4A:
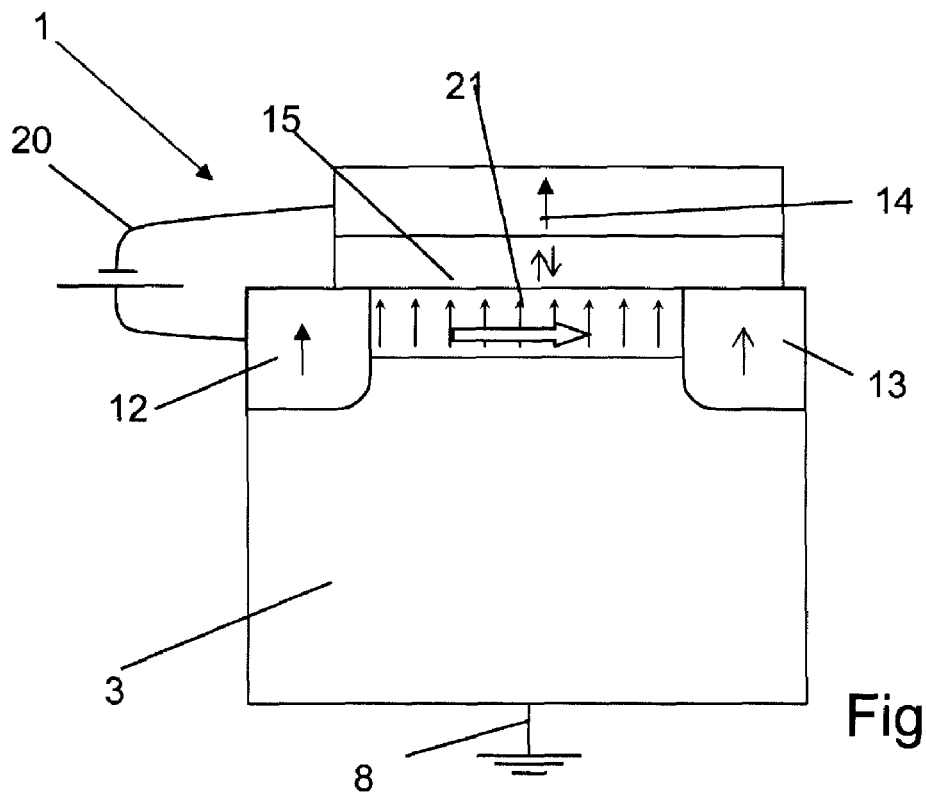
FIGS. 4a and 4b show cross sections through a fourth embodiment of a programmable device in two switching states.
Figure 4B:
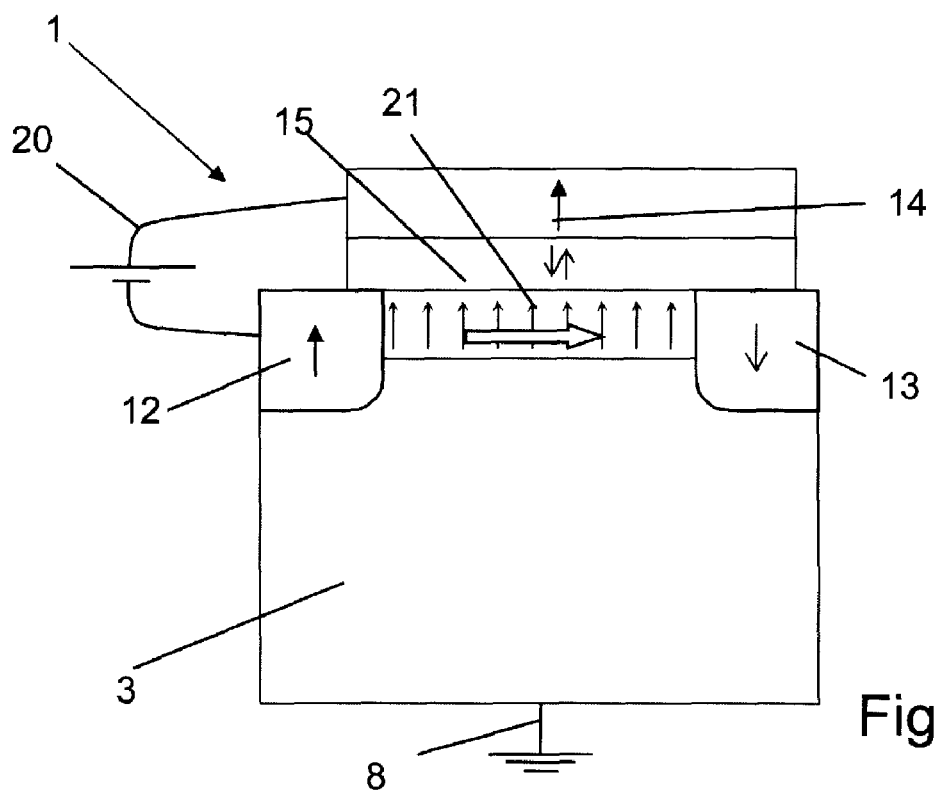

Another embodiment of a programmable device 1 is shown in FIGS. 4a and 4b (again showing, in analogy to FIGS. 2a and 2b, the open and closed states of the programmable device 1, respectively). In this configuration, the ferromagnetic drain electrode 13 is switchable, i.e. has a magnetization the direction of which is switchable. To this end, the drain electrode is in direct contact with the multiferroic material 15 and exchange coupled to it. The effective coercivity of the drain electrode 13 magnetization is smaller than the effective exchange coupling.

The ferromagnetic layer 14 producing the stray field for influencing the orientation of the magnetic moments has a fixed magnetization. For example, a preferably electrically insulating spacer layer (not shown) between the multiferroic material 15 and the ferromagnetic layer 14 may impede an exchange coupling between the ferromagnetic layer and the multiferroic material. In addition or as an alternative, the ferromagnetic layer may be "pinned," i.e., its magnetization may be fixed, for example by an exchange coupling (not shown) to a further, for example, antiferromagnetic layer on top if it. Alternatively, the ferromagnetic layer may be magnetically hard, i.e. have a high coercivity.

In contrast to the previously described embodiments, the charge carriers in the embodiment of FIGS. 4a and 4b are not subject to different spin rotation in the open and closed states. Rather, the ferromagnetic detector changes its sensitivity by having its magnetization switched. The spin valve effect causes, in analogy to the embodiments shown in the other figures, the electrical resistance to be different between the "open" state (FIG. 4a) and the "closed" state (FIG. 4b).

Figure 5A:
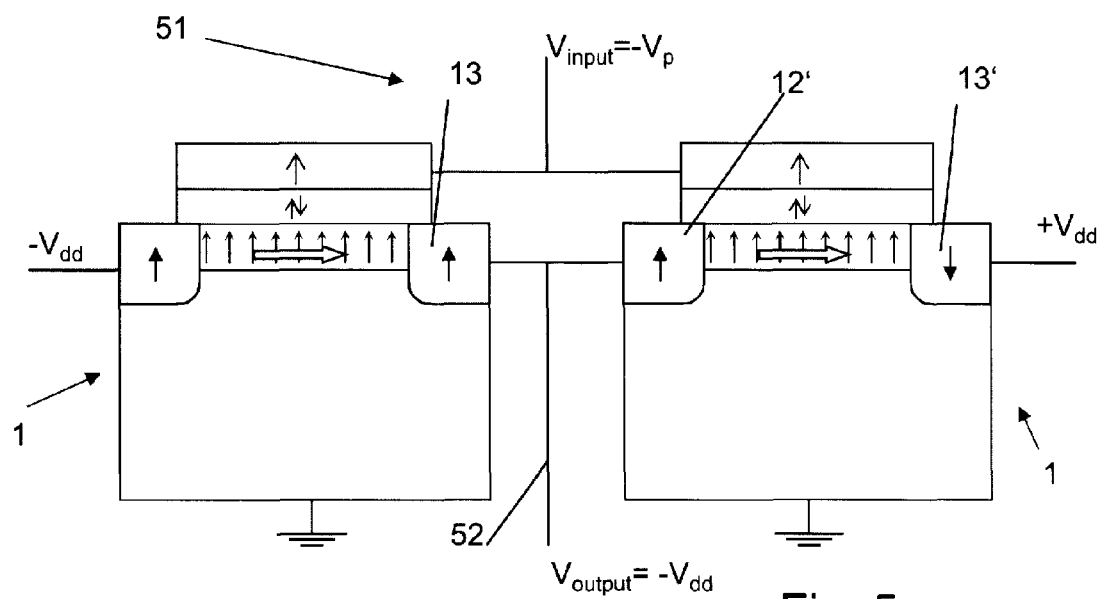
FIGS. 5a and 5b show cross sections through a logic device comprising two programmable devices in two switching states.
Figure 5B:
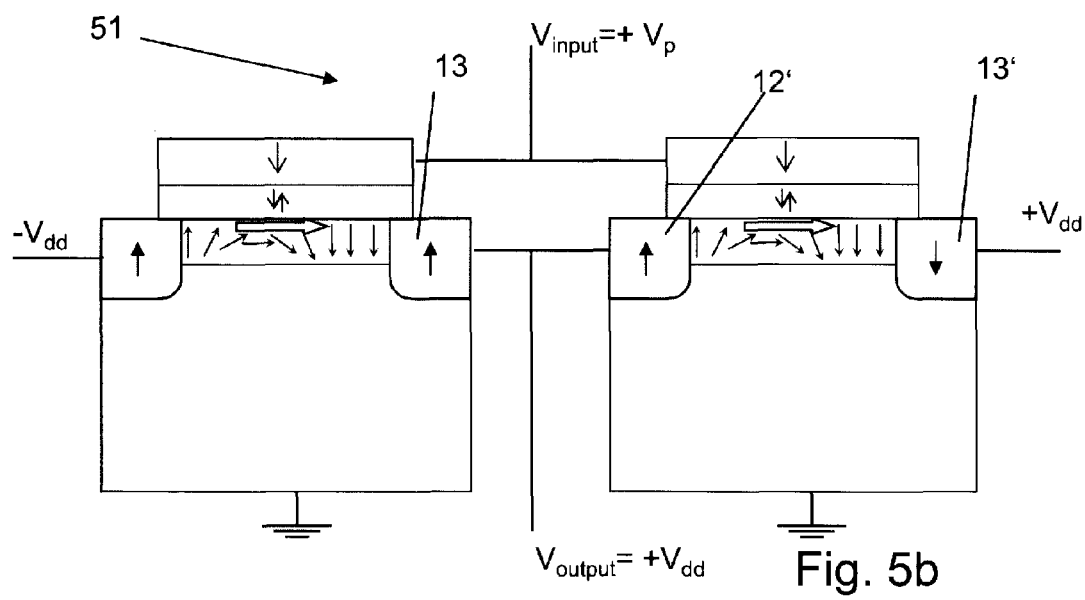

Referring to FIGS. 5a and 5b, a logic element 51 similar to a CMOS inverter can be formed combining two programmable devices 1, 1' according to the present invention. For reasons of simplicity, it is assumed that the resistance in the closed state is larger than the resistance in the open state by orders of magnitude (thus "R=∞" in the closed state, and "R=0" in the open state; in physical reality this will, of course, be achieved only approximately).

In the depicted embodiment, two programmable devices as described referring to FIGS. 2a and 2b are used. The ferromagnetic detector magnetization (the drain electrode 13, 13' magnetization) of the two programmable devices of the logic element is oriented antiparallel with respect to each other. The gate electrodes of the two programmable devices are connected in parallel, and the drain electrode 13 of the first programmable device is in electrical contact with the source electrode 12' of the second programmable device and with an output terminal 52. The source electrode of the first programmable device 1 is connected to a first voltage ($-V_{DD}$), and the drain electrode of the second programmable device 11 is connected to a second voltage ($+V_{DD}$), Depending on the polarity of the input voltage, either the first voltage (FIG. 5a) or the second voltage (FIG. 5b) will be connected to an output port 52. Once the magnetization of the ferromagnetic gate layers is set by the input voltage across the multiferroic layer, the output retains its logic state even when the power supply is disconnected.

Figure 6A:
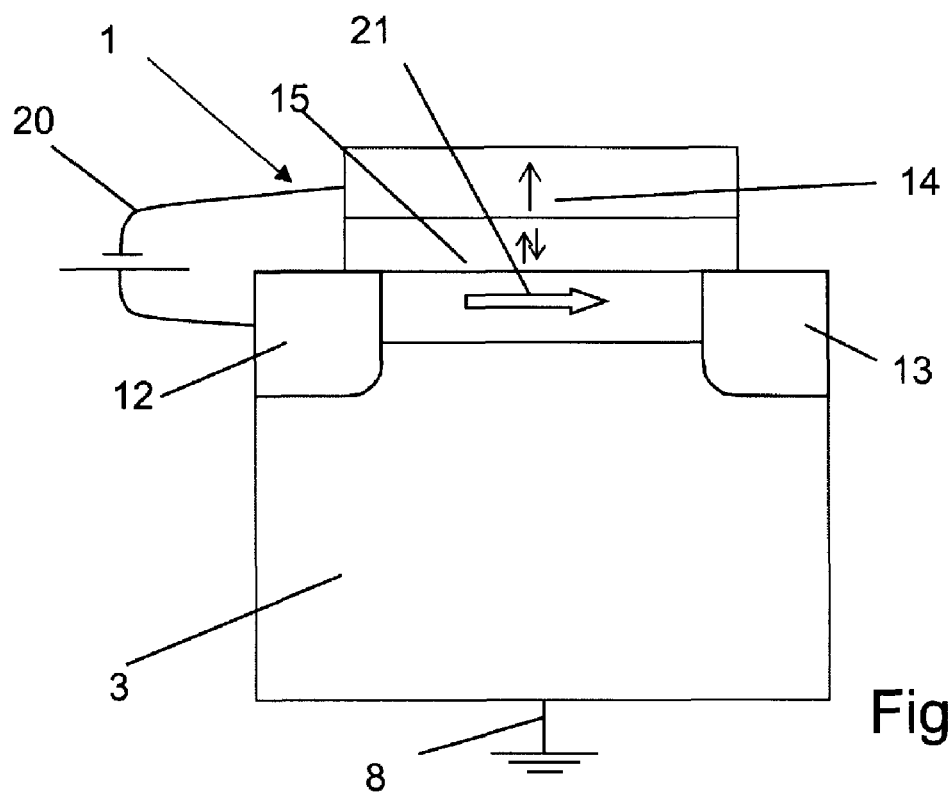
FIGS. 6a and 6b show yet another alternative embodiment of a programmable device according to the present invention in two switching states.
Figure 6B:
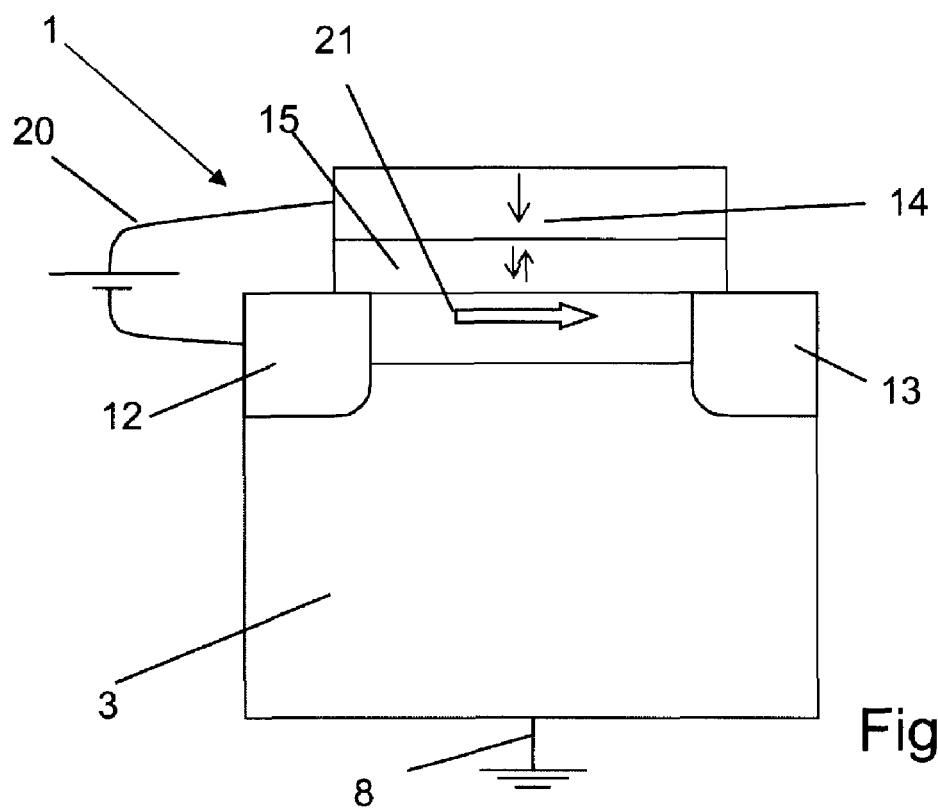
Figure 7:
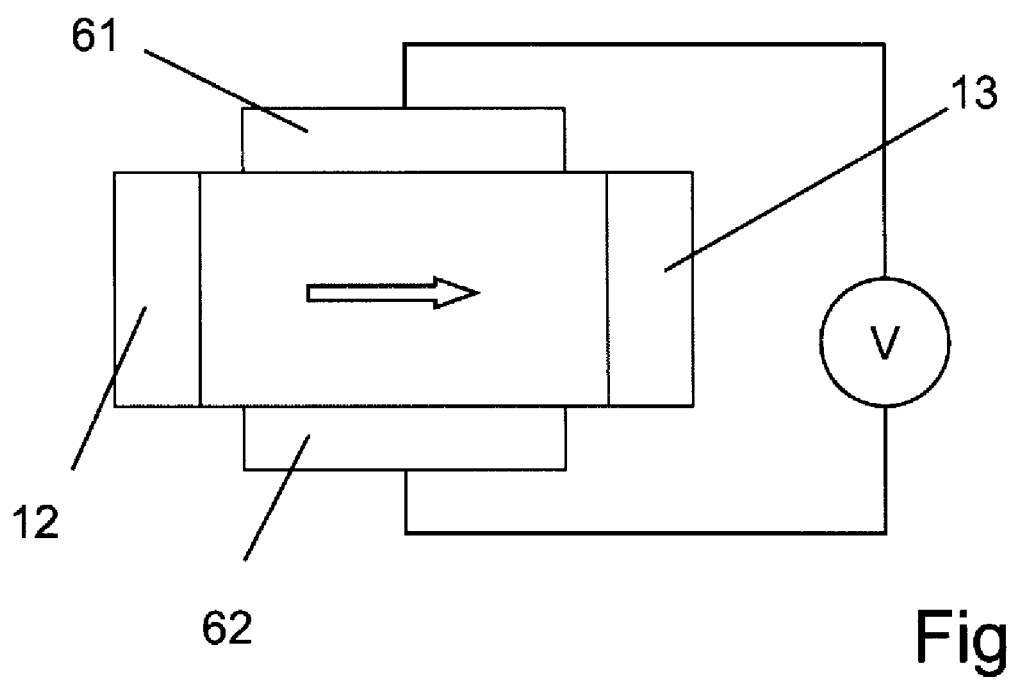
FIG. 7 shows a top view of the arrangement of FIGS. 6a and 6b.

An even further embodiment of a programmable device 1 according to the present invention is depicted in FIGS. 6a, 6b, and 7. FIGS. 6a and 6b show the open and closed switching states, respectively. This embodiment differs from the previously described embodiments in that the Hall effect instead of the spin valve effect is used for determining the direction of the magnetization of the gate ferromagnet 14. Embodiments of programmable devices based on this effect or Tunneling Magnetoresistance/Giant Magnetoresistance or on a movable probe are primarily useable as memory elements, whereas applications for logic elements are less manifest.

In the embodiment of FIGS. 6a and 6b, if a current flows between the source and drain electrodes, the stray field produced by the gate ferromagnet 14, because of the Hall effect, produces an electrical voltage in the direction perpendicular to both, the current direction and the magnetic field direction. This electrical voltage may be measured by additional electrodes 61, 62.

A magnetic tunneling junction to a fixed-magnetization ferromagnet (thus a thin insulating layer and a fixed-magnetization (pinned) ferromagnet atop the gate ferromagnet 14 in the arrangement of FIGS. 6a, 6b) would be yet another alternative means for measuring the magnetization direction of the gate ferromagnet.

Various other embodiments may be envisioned. For example, in the "spin valve" embodiments, the spin valve effect does not rely on the magnetic moments being, in the "open" state, parallel (or antiparallel) to the current path ferromagnetic material. As an alternative, they may have a magnetic moment that is at an angle (such as orthogonal) to the current path ferromagnetic material magnetization and still encounter a relatively low energy barrier at the junction. Also in the other (closed) state, the magnetic moments need not be exactly antiparallel as illustrated, for simplicity, in the above embodiments, but may be approximately antiparallel or similar. Depending on the current path (for example drain electrode) ferromagnetic material, the "closed" state may even correspond to the state with parallel magnetizations (see the above remark on "strong" ferromagnets). The general principle is that the switching influences a relative orientation of the orientation of magnetic moments of charge carriers flowing across the junction and a magnetization of the current path ferromagnetic material, and that the electrical resistance between source and drain electrodes differs between the two switching states because of this relative orientation change.

While the present invention has been described with reference to preferred embodiments thereof, those skilled in the art will recognize that the above and other changes in form and details may be made without departing from the spirit and scope of the present invention as defined in the following claims.

What is claimed is:

1. A programmable device, comprising:
   a source electrode;
   a drain electrode;
   a gate having an antiferromagnetic multiferroic material, said gate being switchable by application of an electrical signal thereto between a first switching state with a first spontaneous polarization direction and a second switching state with a second spontaneous polarization direction;
   a first material selected from the group consisting of ferromagnetic material and ferrimagnetic material, said first material being in immediate contact with the multiferroic material, a magnetization of the first material being switchable by a transition between the first switching state and the second switching state of the multiferroic material by an exchange coupling between electronic states of the multiferroic material and the first material; and
   means for determining a direction of the magnetization of the first material;
   wherein:
   transitions between the first and second switching states cause an electrical resistance between the source electrode and the drain electrode across a channel region to switch;
   a current path between the source electrode and the drain electrode includes a junction between a channel region material and a current path ferromagnetic material; and
   the switching of the electrical resistance between the source electrode and the drain electrode is due to a spin valve effect, wherein the switching state of the multiferroic material influences (i) a relative orientation of magnetic moments of charge carriers flowing across the junction and (ii) a magnetization of the current path ferromagnetic material.

2. The programmable device according to claim 1, wherein the current path ferromagnetic material is present in at least one of the drain electrode and the source electrode, thus making the at least one of the drain electrode and the source electrode ferromagnetic.

3. The programmable device according to claim 1, wherein: the first material in immediate contact with the multiferroic material is either a gate ferromagnet or a ferrimagnet arranged in the gate and is capable of causing a magnetic field to be impinge on charge carriers flowing in the channel region.

4. The programmable device according to claim 1, wherein the first material in immediate contact with the multiferroic material is the current path ferromagnetic material.

5. The programmable device according to claim 4, further comprising:

contacts for applying the electrical signal between a gate contact and one of the source electrode, the drain electrode, and a bulk contact.

6. The programmable device according to claim 1, wherein the means for determining a direction of the magnetization of the first material comprises a Hall probe.

7. The programmable device according to claim 1, wherein the means for determining a direction of the magnetization of the first material comprises either a tunnel magnetoresistance probe or a giant magnetoresistance probe.

8. A logic element, comprising:
   a first programmable device according to claim 1; and
   a second programmable device according to claim 1;
   wherein:
   a portion of the first programmable device has fixed magnetization direction and the corresponding portion of the second programmable device has different fixed magnetization direction; and
   the drain electrode of the first programmable device and the source electrode of the second drain electrode are electrically connected so that the electrical signal can simultaneously be applied to the gates of the first and the second programmable device.

9. A logic circuit comprising a plurality of logic elements according to claim 8.

10. A memory element, comprising:
    a plurality of programmable devices according to claim 1 serving as memory cells;
    a plurality of contacts for applying electrical signals individually to the gates of the programmable devices; and
    a plurality of contacts for measuring an electrical resistance between the source and the drain electrode of an individually addressed programmable device for reading the memory device.

11. A programmable device comprising:
    a source electrode;
    a drain electrode;
    a gate having a multiferroic material;
    an electrical resistance between the source electrode and the drain electrode providing a current path via a channel region, wherein the resistance is switchable by application of an electrical signal to the gate, wherein the current path comprises a junction between a channel region material and a current path ferromagnetic material, and wherein the electrical resistance between the source electrode and the drain electrode is switchable due to a spin valve effect so that a switching state of the multiferroic material influences (i) a relative orientation of magnetic moments of charge carriers flowing across the junction and (ii) a magnetization of the current path ferromagnetic material.

12. The programmable device according to claim 11, wherein the current path ferromagnetic material is present in at least one of the drain electrode and the source electrode, making said at least one of the drain electrode and the source electrode ferromagnetic.

13. The programmable device according to claim 12, wherein both the source electrode and the drain electrode are ferromagnetic, causing the programmable device to comprise a ferromagnetic injector for spin polarized charge carriers.

14. The programmable device according to claim 13, wherein the gate further comprises a gate magnet, which is selected from the group consisting of a gate ferromagnet and a gate ferrimagnet, capable of causing a magnetic field to be present in the channel region, the magnetic field influencing an orientation of charge carrier magnetic moments of charge carriers flowing in the channel region and to the junction.

15. The programmable device according to claim 14, wherein the multiferroic material is a multiferroic antiferromagnet.

16. The programmable device according to claim 15, wherein the gate magnet is coupled to the multiferroic antiferromagnet, a magnetization direction of the gate magnet being switchable by the coupling to the multiferroic antiferromagnet due to the application of the electrical signal to the gate.

17. The programmable device according to claim 16 further comprising a dielectric layer between the channel region and the gate magnet, the gate magnet being a layer between the multiferroic antiferromagnet and the dielectric layer.

18. The programmable device according to claim 17, wherein the multiferroic antiferromagnet is arranged between the gate magnet and the channel region.

19. The programmable device according to claim 18, further comprising contacts for applying the electrical signal between the gate magnet and one of the source electrode, the drain electrode, and a bulk contact.

20. The programmable device according to claim 19, wherein the multiferroic antiferromagnet is arranged immediately adjacent to the channel region.

21. The programmable device according to claim 16, wherein one of the drain electrode and the source electrode is ferromagnetic and coupled to the multiferroic antiferromagnet, a magnetization direction of the drain electrode or source electrode being switchable by the coupling to the multiferroic antiferromagnet due to the application of the electrical signal to the gate.

22. The programmable device according to claim 21, wherein the multiferroic material is a multiferroic magnet selected from the group consisting of a multiferroic ferromagnet and a multiferroic ferrimagnet and is capable of causing a magnetic field to be present in the channel region.

23. A logic element, comprising:
a first programmable device according to claim 11; and
a second programmable device according to claim 11;
wherein:
a portion of the first programmable device has a first fixed magnetization direction and the corresponding portion of the second programmable device has a fixed second magnetization direction that is different from the first magnetization direction; and
the drain electrode of the first programmable device and the source electrode of the second programmable device are electrically connected so that the electrical signal can be simultaneously applied to the gates of the first and second programmable devices.

24. A memory element, comprising:
a plurality of programmable devices according to claim 11, each programmable device serving as a memory cell;
a plurality of contacts for applying electrical signals individually to the gates of the programmable devices; and
a plurality of contacts for measuring an electrical resistance between the source and the drain electrode of an individually addressed programmable device for reading the memory device.

* * * * *